United States Patent
Wilson

(10) Patent No.: US 7,443,217 B2
(45) Date of Patent: Oct. 28, 2008

(54) CIRCUIT AND METHOD TO BALANCE DELAYS THROUGH TRUE AND COMPLEMENT PHASES OF DIFFERENTIAL AND COMPLEMENTARY DRIVERS

(75) Inventor: John T. Wilson, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 161 days.

(21) Appl. No.: 11/369,452

(22) Filed: Mar. 7, 2006

(65) Prior Publication Data

US 2007/0210831 A1    Sep. 13, 2007

(51) Int. Cl.
  *H03K 3/037* (2006.01)
(52) U.S. Cl. .................. 327/199; 327/141; 327/65; 327/258; 326/82; 326/26
(58) Field of Classification Search .................. 327/285, 327/263, 258; 326/82, 26
  See application file for complete search history.

(56) References Cited

U.S. PATENT DOCUMENTS

| | | | |
|---|---|---|---|
| 5,949,269 A * | 9/1999 | Allen .......................... 327/285 |
| 6,208,184 B1 * | 3/2001 | Demicheli et al. .......... 327/161 |
| 6,529,033 B1 * | 3/2003 | Park et al. ..................... 326/16 |
| 6,700,420 B2 * | 3/2004 | Spehar ....................... 327/141 |
| 2002/0121918 A1 * | 9/2002 | Alani et al. .................... 326/26 |
| 2004/0066216 A1 * | 4/2004 | Spehar ......................... 327/65 |
| 2004/0202270 A1 * | 10/2004 | Lentine et al. .............. 375/376 |
| 2005/0146367 A1 * | 7/2005 | Chauhan et al. ............. 327/199 |

* cited by examiner

*Primary Examiner*—Vibol Tan
(74) *Attorney, Agent, or Firm*—Alan K. Stewart; W. James Brady; Frederick J. Telecky, Jr.

(57) ABSTRACT

A circuit for balancing delays through true and complement phases of complementary drivers includes: a first driver; a second driver; a first delay device coupled to an input of the first driver and having an input coupled to an input signal node; a second delay device coupled to an input of the second driver and having an input coupled to the input signal node through a first inverter, wherein the first and second delay devices are clocked such that an input signal reaches the first driver simultaneously with an inverted input signal reaching the second driver.

8 Claims, 2 Drawing Sheets

CROSS-POINT VARIATION CAUSED BY TRUE AND COMPLEMENT DELAY SKEW FROM INVERTER

CIRCUIT AND METHOD TO BALANCE DELAYS THROUGH TRUE AND COMPLEMENT PHASES OF DIFFERENTIAL AND COMPLEMENTARY DRIVERS

FIELD OF THE INVENTION

The present invention relates to electronic circuitry and, in particular, to a circuit for balancing delays through true and complement phases of complementary drivers.

BACKGROUND OF THE INVENTION

Standard prior art complementary and differential driver designs have a single data input and use an inverter to provide the complementary phase input signal. This extra inversion between the true and complement delay paths introduces a delay difference that distorts the output signal cross-point, increases duty cycle distortion, and increases deterministic jitter. As transmission speeds increase and timing budgets shrink, these errors become a problem for high performance designs.

A typical prior art typology for complementary drivers is shown in FIG. 1. The circuit includes drivers 20 and 22; inverters 24 and 26; input A; complementary signals AT and AZ; complementary outputs Y and YZ; and output voltage Vdiff. Inverter 26 is used to generate the phase difference of true and complement output paths Y and YZ. A plot of the resulting delay skew caused by inverter 26 is shown in FIG. 2. The usual means to mitigate the impact of the extra inversion between true and complement paths is to add extra load to slow down the delay for the path with fewer inversions. Alternatively, the inverters for the longer delay path can be increased in size to speed up that path. The delay can be balanced for a particular set of process, voltage, temperature and input slew rate. Extra buffering of the input also helps reduce edge rate dependency, but will increase the propagation delays. However, the circuit will not remain in balance for all process, temperature, voltage, and input slew rate conditions. This asymmetry in delay path is also undesirable as it relies on accurate predictability of the parasitic resistance and capacitance for a given technology node.

SUMMARY OF THE INVENTION

A circuit for balancing delays through true and complement phases of complementary drivers includes: a first driver; a second driver; a first delay device coupled to an input of the first driver and having an input coupled to an input signal node; a second delay device coupled to an input of the second driver and having an input coupled to the input signal node through a first inverter, wherein the first and second delay devices are clocked such that an input signal reaches the first driver simultaneously with an inverted input signal reaching the second driver.

DETAILED DESCRIPTION OF PREFERRED EMBODIMENTS

Figure 1:
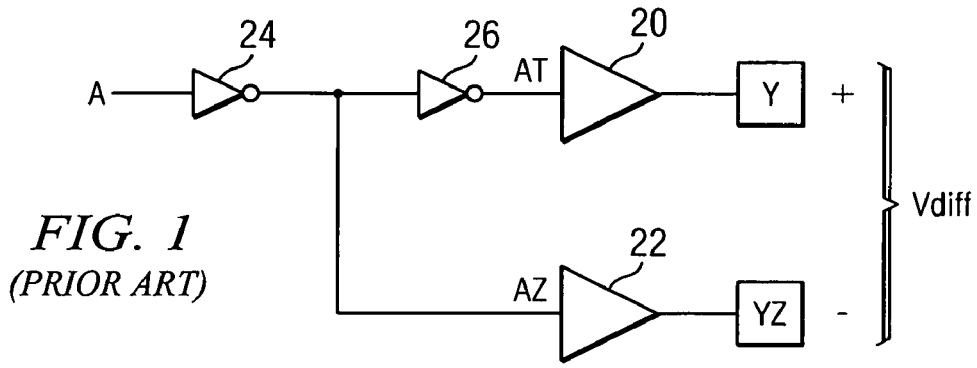
FIG. 1 is a circuit diagram of a prior art complementary driver circuit.
Figure 2:
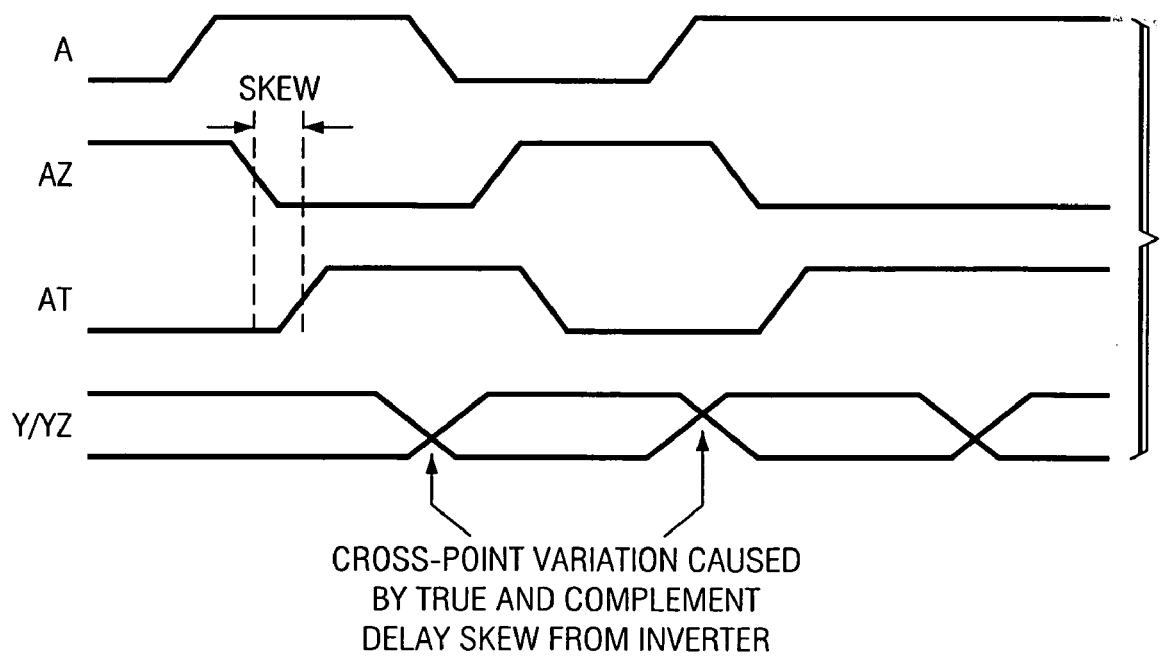
FIG. 2 is a plot of the resulting delay skew caused by inverter 26 in FIG. 1.
Figure 3:
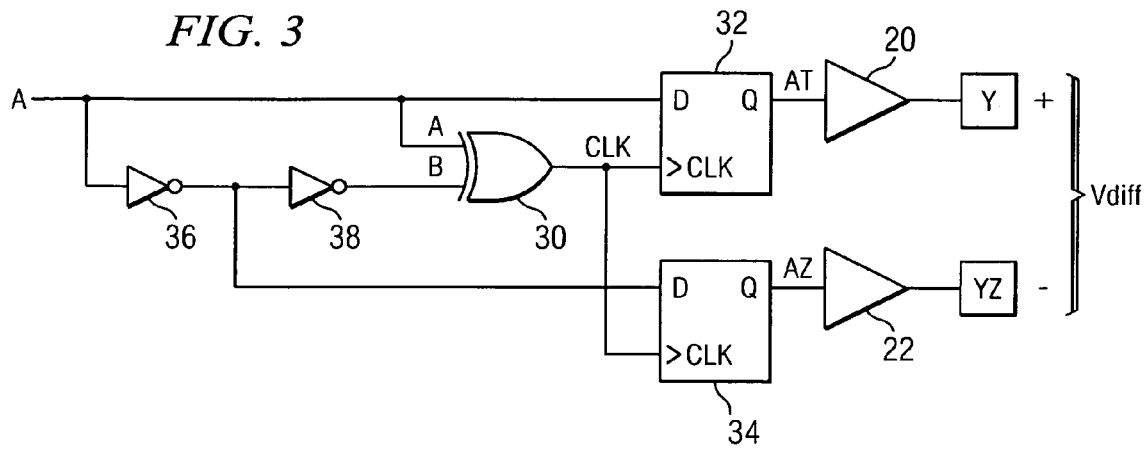
FIG. 3 is a circuit diagram of a preferred embodiment complementary driver circuit, according to the present invention.
Figure 4:
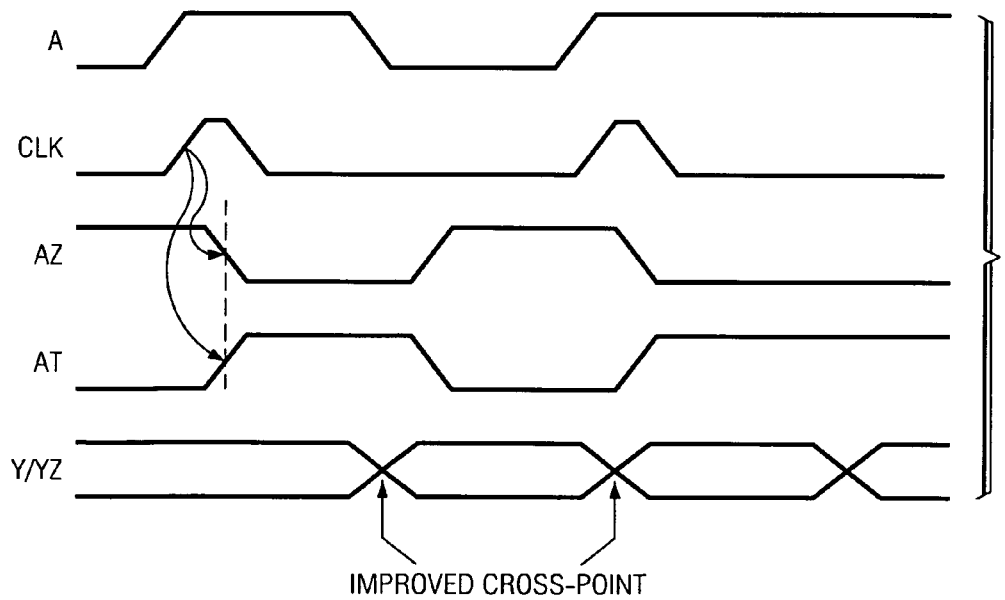
FIG. 4 is a plot of the resulting delay skew of the preferred embodiment circuit of FIG. 3.

A circuit topology, according to the present invention, eliminates the difference in the number of delays between true and complement delay paths. A preferred embodiment circuit is shown in FIG. 3. The circuit of FIG. 3 includes drivers 20 and 22; XOR gate 30 (logic gate); XOR gate inputs A and B; D flip-flops 32 and 34 (delay devices); inverters 36 and 38; input A; complementary signals AT and AZ; complementary outputs Y and YZ; and output voltage Vdiff. In the circuit of FIG. 3, the number of inversions is equal for true and complement output delay paths. A plot of the resulting delay skew is shown in FIG. 4. In the preferred embodiment circuit topology, the true and complement delay skew is improved. The intrinsic delay difference due to the inverter is eliminated. Both signals AZ and AT are triggered from a common clock pulse CLK. The circuit uses XOR gate 30 to generate a short duration pulse whenever the data input toggles. This pulse is used to clock a pair of D flip-flops 32 and 34 whose Q outputs drive the remainder of true and complement logic of the output. Because the flops are triggered by a common clock signal CLK, the delays between the two phases are equal. The two delay paths through the flip-flops 32 and 34 are symmetrically balanced and do not have any differences in the number of inversions. This example preferred embodiment circuit is for a zero-setup time positive-edge triggered flip-flop. The positive pulse width of the clock signal CLK can be widened by adding extra inverters to input B of XOR gate 30 to meet pulse width needs of the flip-flop.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a first driver;
   a second driver;
   a first delay device coupled to an input of the first driver and having an input coupled to an input signal node;
   a second delay device coupled to an input of the second driver and having an input coupled to the input signal node through a first inverter, wherein the first and second delay devices are clocked such that an input signal reaches the first driver simultaneously with an inverted input signal reaching the second driver; and
   a logic gate having an output coupled to a clock input of the first delay device and to a clock input of the second delay device, a first input coupled to the input signal node, and a second input coupled to the input signal node through the first inverter and a second inverter.

2. The circuit of claim 1 wherein the first and second delay devices are flip-flops.

3. The circuit of claim 1 wherein the first and second delay devices are D flip-flops.

4. The circuit of claim 1 wherein the logic gate is an XOR gate.

5. A circuit comprising:
   a first driver;
   a second driver;

a first delay device coupled to an input of the first driver;
a second delay device coupled to an input of the second driver;
a logic gate having an output coupled to a clock input of the first delay device and to a clock input of the second delay device;
an input signal node coupled to an input of the first delay device and to a first input of the logic gate;
a first inverter coupled between the input signal node and an input of the second delay device; and
a second inverter coupled between the first inverter and a second input of the logic gate.

6. The circuit of claim 5 wherein the first and second delay devices are flip-flops.

7. The circuit of claim 5 wherein the first and second delay devices are D flip-flops.

8. The circuit of claim 5 wherein the logic gate is an XOR gate.

* * * * *